(12) United States Patent
Nayak et al.

(10) Patent No.: US 6,494,219 B1
(45) Date of Patent: Dec. 17, 2002

(54) APPARATUS WITH ETCHANT MIXING ASSEMBLY FOR REMOVAL OF UNWANTED ELECTROPLATING DEPOSITS

(75) Inventors: Radha Nayak, Redwood City, CA (US); Yezdi Dordi, Palo Alto, CA (US); Joseph Stevens, San Jose, CA (US); Peter Hey, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 121 days.

(21) Appl. No.: 09/614,406

(22) Filed: Jul. 12, 2000

Related U.S. Application Data
(60) Provisional application No. 60/191,387, filed on Mar. 22, 2000.

(51) Int. Cl.[7] .............................. B08B 3/08; C23F 1/00
(52) U.S. Cl. ................... 134/56 R; 134/153; 134/902; 156/345; 438/748
(58) Field of Search .................. 134/56 R, 58 R, 134/98.1, 102.2, 107, 113, 153, 166 R, 198, 902; 156/345; 438/745, 748

(56) References Cited

U.S. PATENT DOCUMENTS

| | | | | |
|---|---|---|---|---|
| 3,769,992 A | * | 11/1973 | Wallestad | 134/144 |
| 3,775,202 A | * | 11/1973 | Meek et al. | 156/345 |
| 4,518,678 A | | 5/1985 | Allen | 430/311 |
| 4,830,888 A | * | 5/1989 | Kobayashi et al. | 118/425 |
| 4,899,767 A | * | 2/1990 | McConnell et al. | 134/102.2 |
| 4,984,597 A | * | 1/1991 | McConnell et al. | 134/103.1 |
| 5,148,945 A | | 9/1992 | Geatz | 222/1 |
| 5,330,072 A | | 7/1994 | Ferri, Jr. et al. | 222/1 |
| 5,803,599 A | | 9/1998 | Ferri, Jr. et al. | 366/134 |
| 6,254,760 B1 | * | 7/2001 | Shen et al. | 204/198 |
| 6,299,753 B1 | * | 10/2001 | Chao et al. | 204/237 |
| 6,309,981 B1 | * | 10/2001 | Mayer et al. | 156/345 |
| 6,333,275 B1 | * | 12/2001 | Mayer et al. | 156/345 |

* cited by examiner

Primary Examiner—Randy Gulakowski
Assistant Examiner—Joseph Perrin
(74) Attorney, Agent, or Firm—Moser, Patterson & Sheridan

(57) ABSTRACT

Embodiments of the invention generally provide an etchant mixing assembly for a semiconductor processing system. The etchant mixing assembly includes at least one acid source, at least one oxidizer source, a mixing tank selectively in fluid communication with the at least one acid source and the at least one oxidizer source, and a mixed etchant tank in fluid communication with the mixing tank. Additionally, a system controller configured to sense a low level of fluid in the mixed etchant tank, cause a fresh fluid solution to be mixed in the mixing tank, and cause the fresh fluid solution to the communicated to the mixed etchant tank is also provided in the etchant mixing assembly.

19 Claims, 5 Drawing Sheets

APPARATUS WITH ETCHANT MIXING ASSEMBLY FOR REMOVAL OF UNWANTED ELECTROPLATING DEPOSITS

This application claims the benefit of U.S. Provisional Application No. 60/191,387 filed Mar. 22, 2000, which is herein incorporated by reference.

BACKGROUND OF THE INVENTION

Provisional Application Information

Field of the Invention

The invention relates to electrochemical deposition or electroplating methods, and systems for removal of unwanted deposits resulting from electrochemical deposition or electroplating processes.

Description of the Background Art

In semiconductor processes, multiple processes such as a chemical vapor deposition (CVD), physical vapor deposition (PVD), and electroplating are performed in series on a substrate such as a semiconductor wafer. After electroplating is performed, edge bead removal (EBR) systems remove edge beads and other layers remaining on the substrates.

Modern metal electroplating can be can be accomplished by a variety of methods. Relatively high electrical conductivity, high electromagnetic resistance, good thermal conductivity, and availability in a highly pure form make copper and its alloys a choice electroplating metal. Typically, electroplating copper or other metals and alloys involves initially depositing a thin seed layer (having an approximate thickness of 2000 Angstroms) of a conductive material over the surface of the substrate including the features formed on the substrate. A layer is then plated onto the seed layer by applying an electric charge applied across the seed layer. The seed layer having an electric charge applied thereto attracts metal ions. The deposited layers and the dielectric layers can then be planarized to define a conductive interconnect feature, such as by chemical mechanical polishing (CMP).

During electroplating, metal ions contained in the electrolyte solution deposit on those substrate locations that electrolyte solution contacts that are covered by the seed layer. The seed layer is usually deposited on the front side of the substrate, however the seed layer may extend to the edge or the backside of the substrate. As such, metal may deposit on certain front side, edge, or backside locations that such metal depositions are not desired, as now described.

FIG. 2A shows a cross sectional view of one embodiment of an edge of a substrate 22 including a bevel edge 33, a seed layer 34 deposited on the substrate, and an electroplated conductive metal layer 38 deposited on the substrate. During processing of the substrate, the seed layer 34 is formed on a plating surface of the substrate (the plating surface faces downward in FIG. 2A). The seed layer stops a short distance from the bevel edge 33. A conductive metal layer is then deposited on the seed layer by an electroplating process. The conductive metal layer in FIG. 2A does not form on any portion of the substrate that does not have a seed layer. In the embodiment shown in FIG. 2A, an excess deposit buildup, known as an edge bead 36, forms at the edge of the electroplated layer. The edge bead typically results from locally higher current densities at the edge of the seed layer 34 and usually forms within 2–5 mm from the edge of the substrate. Removal of the edge bead from the substrate is desired to ensure uniform thickness of the conductive metal layer on the substrate 22.

FIG. 2B shows a cross sectional view of another embodiment of an edge of a substrate 22 including the bevel edge 33, the seed layer 34 deposited on the substrate, and the electroplated conductive metal layer 38 in FIG. 2A. In this embodiment, the seed layer 34 covers the front side 35 of the substrate, both bevels 33 on the edge, and for a small distance on the backside 42 of the substrate. This type of seed layer is known as a full coverage seed layer. Metal deposits form on those seed layer surfaces that are exposed to electrolyte solution during electroplating. When a full-coverage seed layer is applied to a substrate, removing the edge bead 36 following the electroplating process is often desired. Removing the deposited layers on the seed layer that occur on the backside and/or edge of the substrate on the full coverage seed layers limit contamination from these layers deposited on the backside of the substrate.

FIG. 3 shows a cross sectional view of yet another embodiment of an edge of a substrate 22 including the bevel edge 33, the seed layer 34 deposited on the substrate, and the electroplated conductive metal layer 38 deposited on the substrate. The electoplated conductive metal layer 38 includes a separated edge deposit 39. Such a separated edge deposit 39 may form on a substrate following electroplating. The separated edge deposit 39 of the seed layer typically forms within 2–5 mm from the deposited edge material. The separated edge deposit often separates from the substrate 22 since the separated edge deposit is not secured to the seed layer that would attach the separated edge deposit to the substrate. A separated edge deposit 39 often tears off during subsequent processing such as chemical mechanical planarization (CMP). The CMP pads that contain material of the separated edge deposit 39 may abrade and damage the substrate during CMP. CMP pads that contain embedded particles may severely damage (by scratching) any wafer to which they contact.

Therefore, during electroplating copper contamination can form on the front, the backside, or the edge of the substrate. Such metal deposition at undesired locations occur from full coverage seed layer wrapping around to the backside, small deposits of electroplated copper on the backside of the substrate, or the copper from the wet electrolyte solution drying on the backside of the substrate. The existence of copper contamination on the backside of the substrate can degrade the performance of an electronic device that uses a portion of the wafer because of altered properties of the substrate. Providing a system by which the copper contamination can be removed from the backside or the edge of the substrate following the metal deposition is desirable.

Edge bead removal (EBR) systems remove the aforementioned edge bead, the separated deposited layer, or certain other undesired deposited layers on the substrate. Nozzles in the EBR systems can be adjusted to direct etchant (that removes the deposits) and/or rinse water at desired locations on the substrate. EBR systems therefore can apply a variety of chemicals at an electroplated substrate where the undesired deposits are located. The chemicals used in EBR systems comprise, for example, a mixture including a prescribed ratio of acid mixed with an oxidizer and deionized water.

Chemicals used in prior EBR systems are mixed in a batch to form an etchant. To limit the effort required to mix a large number of batches frequently, the individual batch sizes are large. The batch is maintained until the etchant is used or until the etchant becomes unusable. The usable lifetime of the etchant in EBR systems varies depending on such parameters as the specific chemicals and amounts of each chemical mixed to form the etchant, the temperature at which the etchant is stored, and the pressure applied to the etchant. However, once the etchant becomes unusable, the etchant must be disposed of and a new batch of etchant must be prepared. One embodiment of etchant used for copper electroplating processes becomes increasingly unstable at higher EBR system temperatures. Unfortunately, etch rates of the chemicals used in EBR systems typically increase with higher temperatures. When operators increase the temperature of the EBR system to increase throughput based on the higher etch rates, the time until each batch of etchant becomes altered or unstable diminishes.

It is desired to maximize throughput in EBR systems since the EBR system represents only one of a large number of expensive processes that are utilized in expensive semiconductor processing systems. The EBR system cannot be used for deposition removal purposes when a new batch of chemicals is being mixed therein to form etchant. Presently, batches of chemicals in EBR systems are mixed by diffusion, so some time is necessary after a large batch is mixed for the chemicals to properly mix into etchant. In an effort to limit down time on an EBR system, the batches of etchant are mixed in a large volume (1 to 4 liters). Such large batches of etchant are difficult to dispose of after the etchant becomes unstable. In addition, some time is necessary to clean the unstable etchant from that equipment used to store, and/or dispense the chemicals.

Therefore, there is a need to provide an EBR device including a mixing tank, where the EBR device mixes chemicals into etchant at or near where the etchant is being used in an amount that can be used by the EBR device.

SUMMARY OF THE INVENTION

The invention generally relates to edge bead removal systems and associated methods that remove unwanted deposited metal from a substrate. An apparatus and associated method supplies etchant to an edge bead removal chamber. The apparatus includes an etchant tank that is capable of storing etchant, a sensor that senses the sensed level of etchant that is contained in the etchant tank, and a mixing tank that mixes one or more chemical components into etchant that is supplied to the etchant tank in response to the sensed level. The present invention is especially applicable to edge bead removal systems, including for example, spin-rinse-dry systems.

BRIEF DESCRIPTION OF THE DRAWINGS

The teachings of the present invention can be readily understood by considering the following detailed description in conjunction with the accompanying drawings, in which:

FIG. 2, comprising

To facilitate understanding, identical reference numerals have been used, where possible, to designate identical elements that are common to the figures.

DETAILED DESCRIPTION

After considering the following description, those skilled in the art will clearly realize that the teachings of the present invention can be readily utilized in edge bead removal (EBR) modules including, or separate from, spin-rinse-dry (SRD) systems. In this disclosure, the term "etchant" refers to any mixture of chemicals used in an EBR module. The term "edge bead" refers to any unwanted deposit on a substrate. The terms wafer, substrate, or object refers to any object, such as a semiconductor wafer, from which an EBR module is used to remove an unwanted deposition layer.

Figure 1:
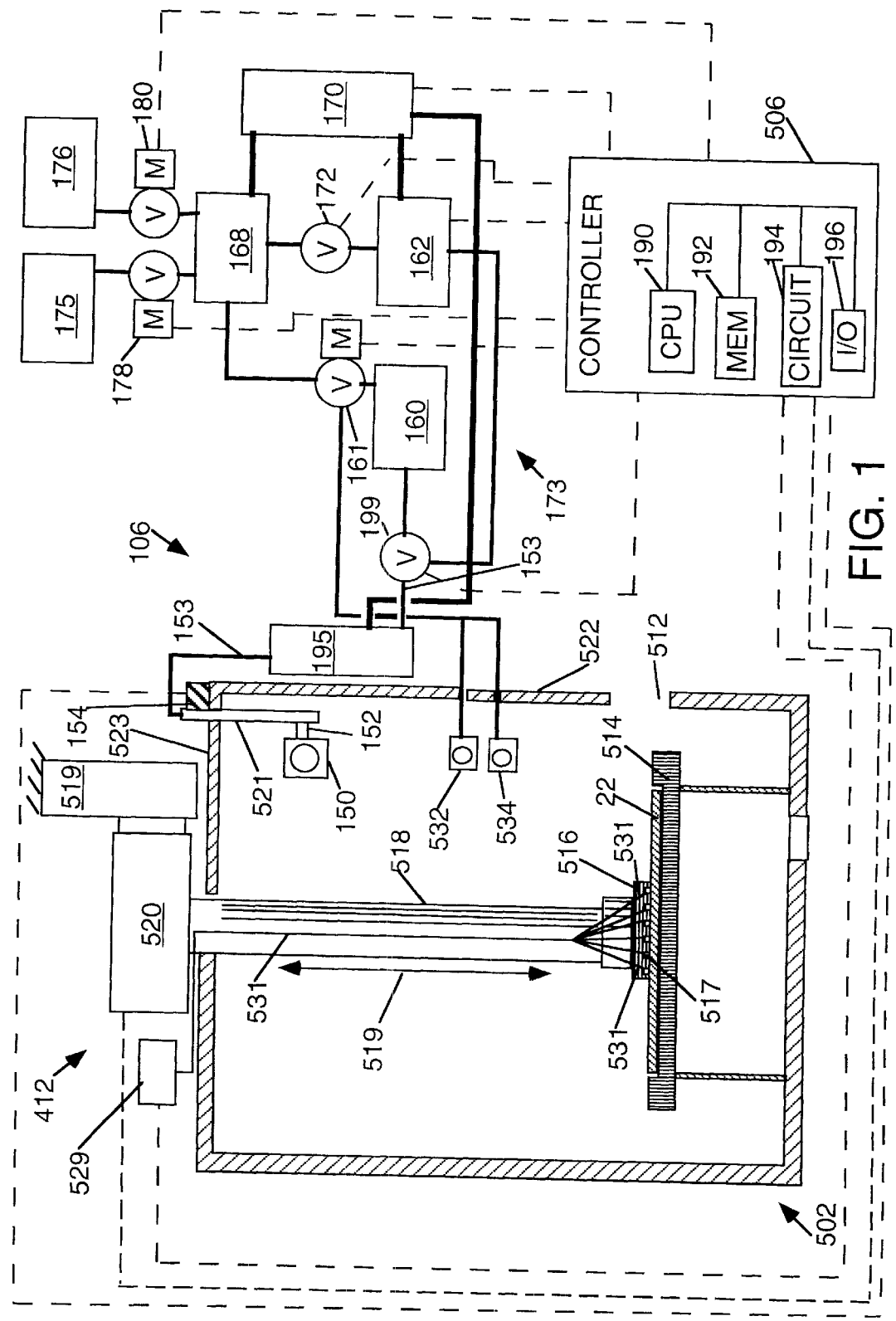
FIG. 1 is an elevational view, partially in cross section view of an embodiment of an edge bevel removal module in accordance with one embodiment of the invention.

FIG. 1 is a side cross sectional view of one embodiment of an EBR module 412. The EBR module 412 generally includes an EBR chamber 502, an etchant/chemical delivery assembly 106, a mixing module 173, and a controller 506. The EBR chamber 502 includes a slit valve 512 disposed therein through which a substrate 22 is inserted into, or removed from, the EBR chamber using a robot arm. Nozzles 150 and rinse water nozzles 532 and 534 are located in the EBR chamber 502. Nozzles 150 can be selectively connected to one or more etchant/chemical sources, including de-ionized water and various etchants. Controller 506 controls the flow rate from the one or more etchant/chemical sources to the nozzles 150.

The plurality of rinse water nozzles 532 and 534 extend through the sidewall 522 of the EBR chamber 502. The rinse water nozzles 532 and 534 are each in fluid communication with the de-ionized water source 160 via valve 161. The rinse water nozzles 532 and 534 are each positioned to dispense water over an adjacent surface of the substrate 22 when the substrate is positioned adjacent to the rinse water nozzles. In one embodiment, one valve 161 controls the rinse water flow to all rinse water nozzles 532 and 534. Alternatively, a separate valve 161 is connected to each one of the rinse water nozzles 532, 534. The valves 161 therefore control the rinse water flow to each rinse water nozzle 532, 534 separately. Nozzles 150 are in fluid communication with the etchant tank 162 via valve 199. Nozzles 150 can thus be used to controllably apply etchant to the edge of the substrate.

One embodiment of a mixing module 173 generally includes a mixing tank 168, an etchant tank 162, a heating tank 195, a plurality of valves 172, 179, and 199, a plurality of metering valves 161, 178, 180, a pressure source 170, a de-ionized water source 160, an acid supply 175, and an oxidizer supply 176. The acid supply 175, the de-ionized water source 160, and the oxidizer supply 176 are all applied under pressure to force the components thereof into the desired mixing module 173. The mixing module 173 mixes a liquid etchant that is capable of etching metal deposited on a substrate (such as a seed layer). The metering valves 161, 178, and 180 are each configured to dispense a controlled, measured quantity of the component chemicals and de-ionized wafer that combine to form the etchant.

A controller 506 comprises a central processor unit (CPU) 190, a memory 192, related circuits 194, an input/output circuit (I/O) 196, and a bus (not shown). The controller 506 controls the operation of the EBR module 412 as described below. A vacuum chuck 516 may engage the substrate 22. A spindle 518 supports a vacuum chuck 516. The vacuum chuck 516 is generally cylindrical in shape and has vacuum grooves 517 formed in the lower surface. An O-ring (not shown) circumscribes the lower face of the vacuum chuck and engages the top of a chucked substrate in some embodiments. The O-ring assists in forming a seal that enhances a vacuum created by vacuum pump 529.

The vacuum source 529 is connected to the vacuum groves 517 in the vacuum chuck 516 by one or more conduits 531. In FIG. 1, the vacuum source 529 is located outside of the EBR chamber 502 with the conduits 531 extending from the vacuum source 529 to the grooves 517. The vacuum applied from the vacuum pump 529 to the grooves 517 supports the substrate adequately to lift the substrate from the platform 514. The upper surface of the platform 514 has an upwardly facing, centrally disposed depression dimensioned to receive the largest substrate to be processed. The depression limits the substrate sliding off the platform 514. A rotary actuator 520 that is supported by a support 519 vertically supports the spindle. Vertical actuation of the rotary actuator 520 causes rotary vertical lifting of the vacuum chuck 516 and the substrate 22. The rotary actuator 520 is also preferably capable of rotating the spindle at a desired controllable angular velocity of, for example, up to about 2000 RPM.

The etchant/chemical delivery assembly 106 comprises one or more nozzles 150 disposed on one or more dispenser arms 152 for dispensing etchant during the EBR operation. The dispenser arm 152 is structurally and fluidly coupled to a post 521 that passes through a container ceiling 523 of the EBR chamber 502. An actuator 527 can angularly displace each post 521 about the axis of the post to extend or retract the dispenser arm 152 as indicated by the arrow 155 in FIG. 7. Rotary actuator 154 extends or retracts the dispenser arm by rotating the post 521 that is rigidly connected to the dispenser arm. Extending or retracting the dispenser arm 152 acts to change the distance between each nozzle 150 and the nearest point on the container sidewall 522. When the dispenser arm 152 is extended, each nozzle 150 is positioned underneath and in close proximity to a substrate being processed. When the nozzles 150 are positioned under a substrate, the nozzles block vertical motion of the substrate 22 past the nozzles 150. When the actuator displaces the dispenser arm 152 into the retracted position, the nozzles 150 are positioned proximate the container sidewall 522. In the retracted position, the nozzles permit vertical movement of the substrate past the nozzles 150. The nozzles 150 are also adjustable so that the nozzles can direct fluid at different angles to contact the edge of a substrate, and so substrates having different diameters are accommodated. Such adjustability of the positioning of the nozzles 150 provides a great deal of flexibility in the use of the nozzles 150 within the EBR chamber 502.

Figure 2A:
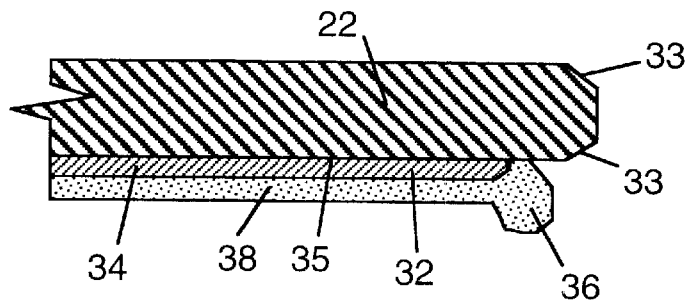
FIGS. 2A and 2B are cross sectional views of two embodiments of excessive edge beads forming on a deposition layer adjacent the periphery of a substrate.
Figure 2B:
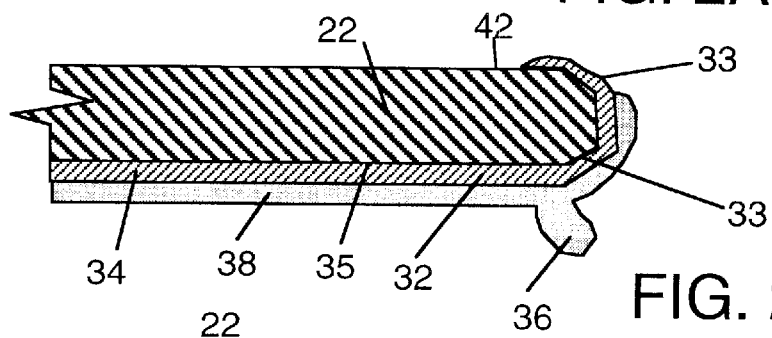
Figure 7:
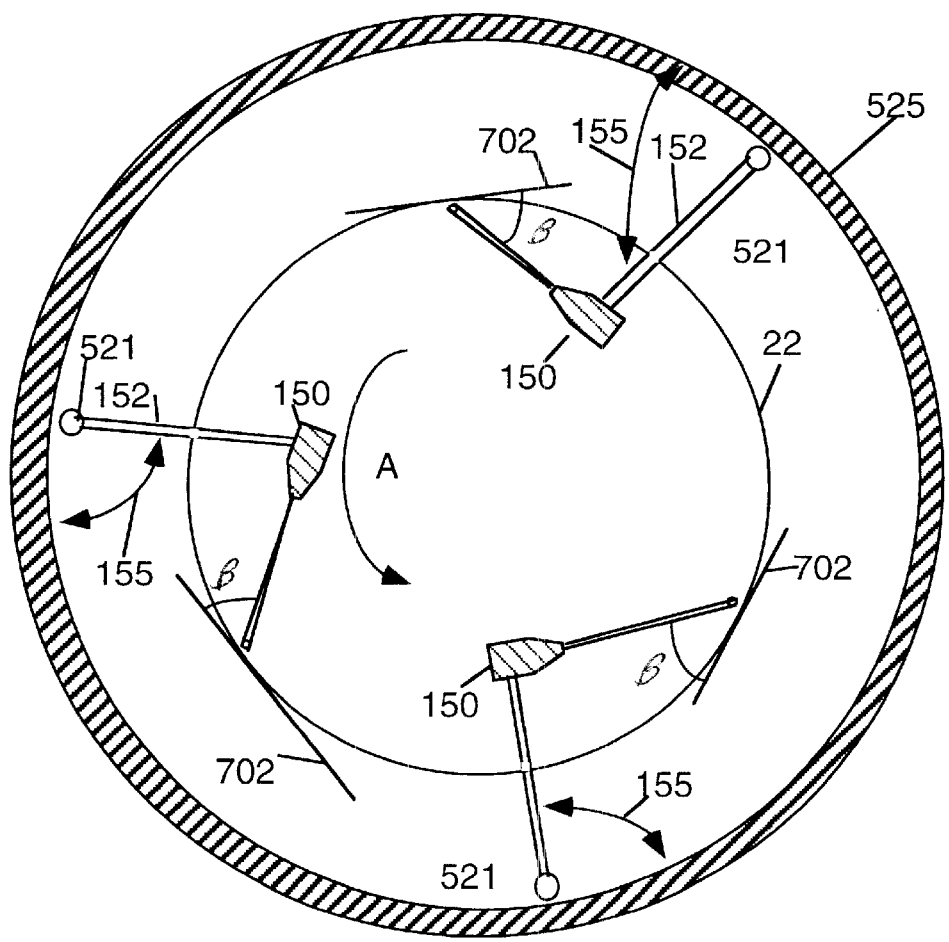
FIG. 7 is a bottom block diagram view of an EBR chamber illustrating one embodiment of the nozzle positions.
Figure 8:
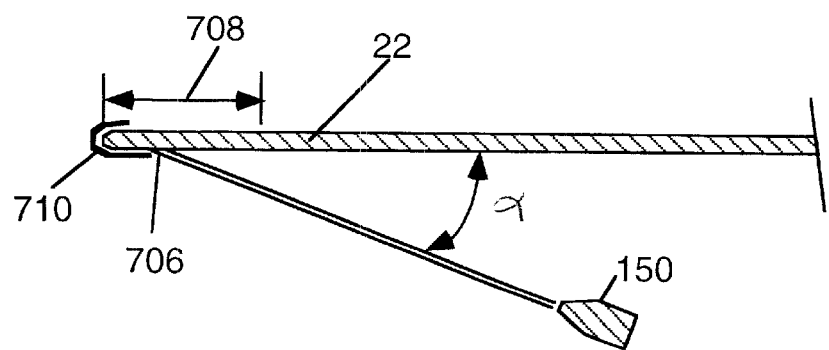
FIG. 8 is a side view of a nozzle disposed in relation to a substrate in the EBR chamber shown in FIG. 7.

Conduit 153 fluidly connects the nozzles 150 to the heating tank 195. The etchant is thus fluidly supplied through the conduit 153 to one of the nozzles 150. The conduit 153 is within, or spaced in close proximity to, the dispenser arm 152. FIGS. 7 and 8 depict respective bottom and side views of one embodiment of the nozzles 150 positioned within the EBR chamber 502 with a substrate 22 in a processed position. In FIG. 7, each nozzle 150 directs the etchant at a horizontal angle $\beta$ relative to a tangent line 702. The tangent line 702 is tangent to the periphery of the substrate. The angle $\beta$ is selected to minimize the splashing of the fluid being applied on other surfaces of the substrate (at direct contact area 706). Preferably, the angle $\beta$ is between 0 degrees and about 45 degrees, and more preferably between about 20 degrees and about 40 degrees. Three nozzles 150 substantially equally spaced are disposed about the interior of the container sidewall 522. Each nozzle 150 can direct etchant at an edge bead 36 of the substrate 33 (shown in FIG. 2A or 2B) when the nozzle 150 is positioned in the extended position depicted in FIG. 6. Alternatively, each nozzle 150 can direct etchant at a separated edge deposit 39 that is separated from the substrate (shown in FIG. 3) when the nozzle 150 is positioned in the extended position depicted in FIG. 6.

Each one of the nozzles 150 is also angled from the horizontal by an angle of incidence $\alpha$ (shown in FIG. 8). The angle of incidence $\alpha$ preferably is between about 20 and about 80 degrees, and most preferably about 45 degrees from horizontal. The fluid being sprayed from nozzles 150 is initially directed with an outward component toward the edge bead proximate the periphery of the substrate, as shown in FIG. 7. This sprayed fluid, after contacting the substrate 22 at direct contact area 706, wraps around to the backside (that faces upward) of the substrate. This wrap around results from surface tension between the fluid and the substrate and effectively redirects the direction of the fluid (towards the center of the substrate) as indicated by arrow 710. The distance that the fluid travels toward the center of the substrate along the upper surface varies based on a variety of factors. These factors include, but are not limited to, angular velocity of the substrate 22, diameter of the substrate, velocity at which the etchant supplied from the nozzles 150 contacts the substrate 22, volumetric flow rate of the etchant from the nozzles 150, and the angular position of the nozzles.

The mixing module supplies chemicals that are mixed to a prescribed ratio and delivered to the nozzles 150 via conduits 153. The mixing module 173 performs online metering, mixing, and dilution of etching and cleaning chemicals. Metering valves 161, 178, and 180 permit the respective de-ionized water, acid, and oxidizer contained in the respective de-ionized water source 160, acid supply 175, and oxidizer supply 176 to be dispensed at a prescribed rate. The dispensed de-ionized water, acid, and oxidizer pass into the mixing tank 168. The metering valves 161, 178, and 180 typically dispense fluid based on the weights of the respective fluids (a prescribed weight of de-ionized wafer, an acid, and an oxidizer are combined). Thus, if the operator wishes to produce a specific chemical combination, the respective weights of water from the de-ionized water source 160, acid from the acid supply 175, and oxidizer from the oxidizer supply 176 are calculated based on the desired etchant chemistry. These weights are input to the controller 506. Alternately, the controller 506 can store the weights of water, certain acids, and certain oxidizers contained in the respective supplies 160, 175, and 176 that are commonly utilized by the EBR module 412.

The mixing tank 168, the etchant tank 162, and the heating tank 195 interact to mix the combination of water from the de-ionized water source 160, the acid from the acid supply 175, and the oxidizer from the oxidizer supply 176 as now described. The mixing tank 168 acts to mix the chemicals inserted therein. The mixing tank 168 is usually empty until more etchant is desired. The etchant tank 162 acts as a holding tank that contains the mixed etchant in a form that is ready for application. The heating tank 195 is provided with heating elements (not shown) that heat the contents thereof to some prescribed temperature (e.g., 55° C.). The heating tank 195 is provided in close proximity (e.g. three feet or less) to the nozzles 150 to ensure that the temperature of the etchant is not altered significantly after leaving the heating tank and prior to being applied to the substrate. The mixing tank 168, the etchant tank 162, and the heating tank 195 are all of a suitable size to respectively mix, dispense, and heat a suitable amount of etchant to be dispensed that could be used within a reasonable time frame by the user of the EBR module 412 without excessive etchant spoilage. For example, a distinct two-liter tank has been found suitable for the mixing tank 168, the etchant tank 162, and the heating tank 195.

Pressure from the pressure source 170 is selectively applied to either the mixing tank 168, the etchant tank 162, and/or the heating tank 195 under the control of the controller 506 to assist in the flow of the chemical components. Typically, the pressure source 170 applies nitrogen gas having a pressure ranging from 5–15 psi.

The individual chemical components can be supplied to the mixing module using a number of alternative supply configurations including:

1) distinct oxidizer, acid, and water pressurized house facility lines are each fluidly connected to the mixing module;
2) distinct drums containing oxidizer, acid, and water are each fluidly connected to the mixing module;
3) an online hydrogen peroxide generation unit fluidly connects to the mixing module. Additionally, distinct house facility acid and water lines fluidly connect to the mixing module. The acid line dispenses a solution including, for example, sulfuric acid or citric acid. The online peroxide generator eliminates the need for storage of large quantities of hydrogen peroxide or other unstable oxidizers; and
4) a combination of the above three alternative supply configurations.

Figure 9:
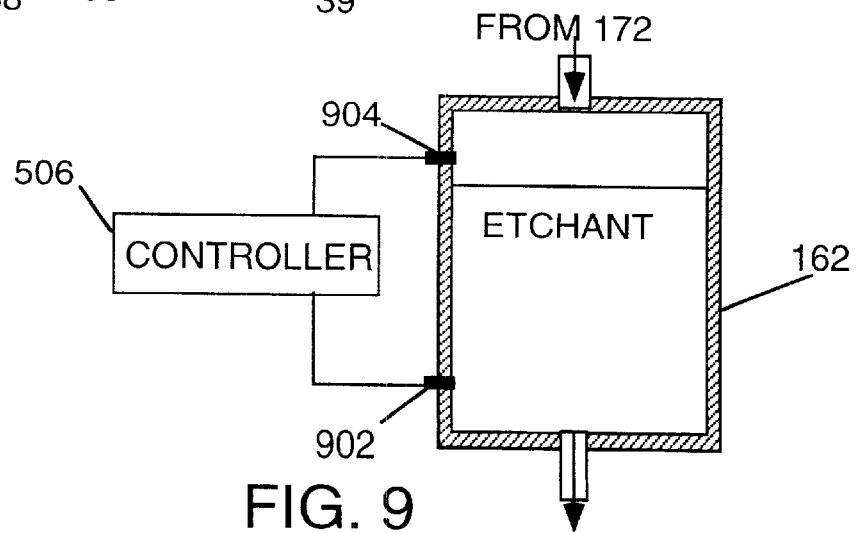
FIG. 9 is a side cross sectional view of one embodiment of etchant tank including a plurality of level sensors.

FIG. 9 shows one embodiment of the etchant tank 162 having a low level sensor 902 and a high level sensor 904. The low level sensor 902 senses the minimum etchant level to be contained in the etchant tank. The high level sensor 904 senses the maximum etchant level to be contained in the etchant tank. The low level sensor 902 and the high level sensor 904 are both optical sensors in the FIG. 9 embodiment. Float sensors, electric or magnetic based sensors, or any known suitable sensors that sense level of a fluid may alternatively be used.

The controller 506 receives the output from low level sensor 902 and high level sensor 904. If the controller 506 receives indication from the low level sensor that the etchant in the etchant tank is below low level sensor 902, more chemical components from sources 160, 175, and 176 are mixed in the mixing tank 168. The mixed chemicals in the mixing tank are then dispensed into the etchant tank until the high level sensor 904 indicates to the controller that the etchant in the etchant tank is at or above the level of the high level sensor. These level sensors may also be applied to the heating tank 195 and/or the mixing tank.

The controller 506 individually controls the supply of acid from the acid supply 175, the oxidizer from the oxidizer supply 176, and the flow of de-ionized water from the de-ionized water source 160. The controller 506 also controls the overall operation of the mixing module 173 including the fluids and their respective flow rates, the pressure, timing of any associated valves, and the spin cycle(s) of the substrates. The controller could be remotely located, for instance, in a control panel or control room and the plumbing associated with the EBR module 412 controlled with remote actuators. The controller 506 is fashioned as a microcontroller, a microprocessor, a general-purpose computer, or any other known applicable type of computer.

The CPU 190 communicates with the memory 192, the related circuits 194 and the I/O 196 over the bus in a known manner. The CPU 190 controls the contents of the tanks 160, 162, and 168 by controlling the operation of valves 161, 172, 178, 180, and 199 by issuing commands via the I/O circuit 196, as described below. The CPU 190 also senses various operating parameters and outputs from sensors (not shown) that are located at different locations throughout the EBR module 412, e.g. temperature, RPM of the spindle 518, etc. to monitor the operation of the system as well as the mixing of the chemicals. The CPU 190 also receives operating commands and set-limits from the related circuit, e.g. by use of a user input (using a keyboard and/or a mouse, for example), as well as a display (using a cathode-ray display or LCD display, for example). The integration of the above elements associated with the controller 506 is well known, and will not be further detailed herein.

In operation, the vacuum chuck 516 is raised slightly from the position shown in FIG. 1 to permit insertion of a substrate 22 through the slit valve 512 onto the platform 514. The substrate is positioned electroplated side down on the platform 514 by a robot device (not shown). The rotary actuator 520 then displaces the spindle 518 and the attached vacuum chuck 516 downwardly until the vacuum chuck 516 contacts the substrate 22. The vacuum chuck is then actuated such that the substrate 22 is attached to the vacuum chuck 516.

Figure 5:
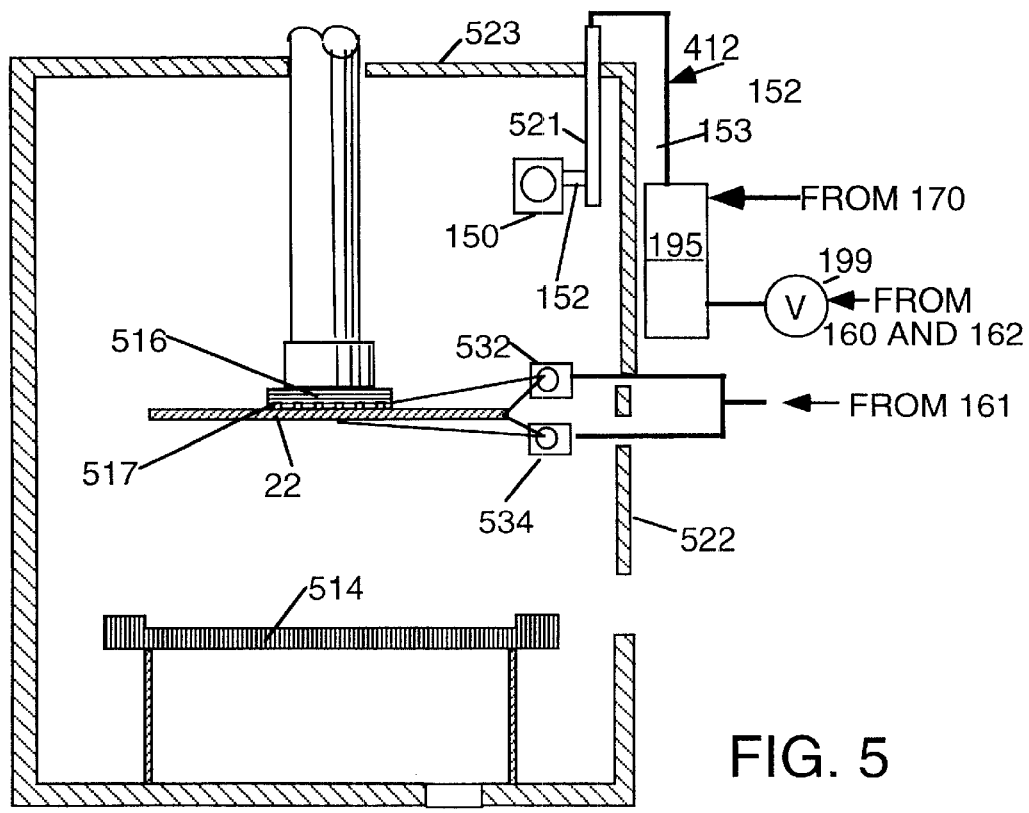
FIG. 5 is a vertical sectional view of an EBR chamber as shown in FIG. 1 with the substrate positioned for rinsing.
Figure 6:
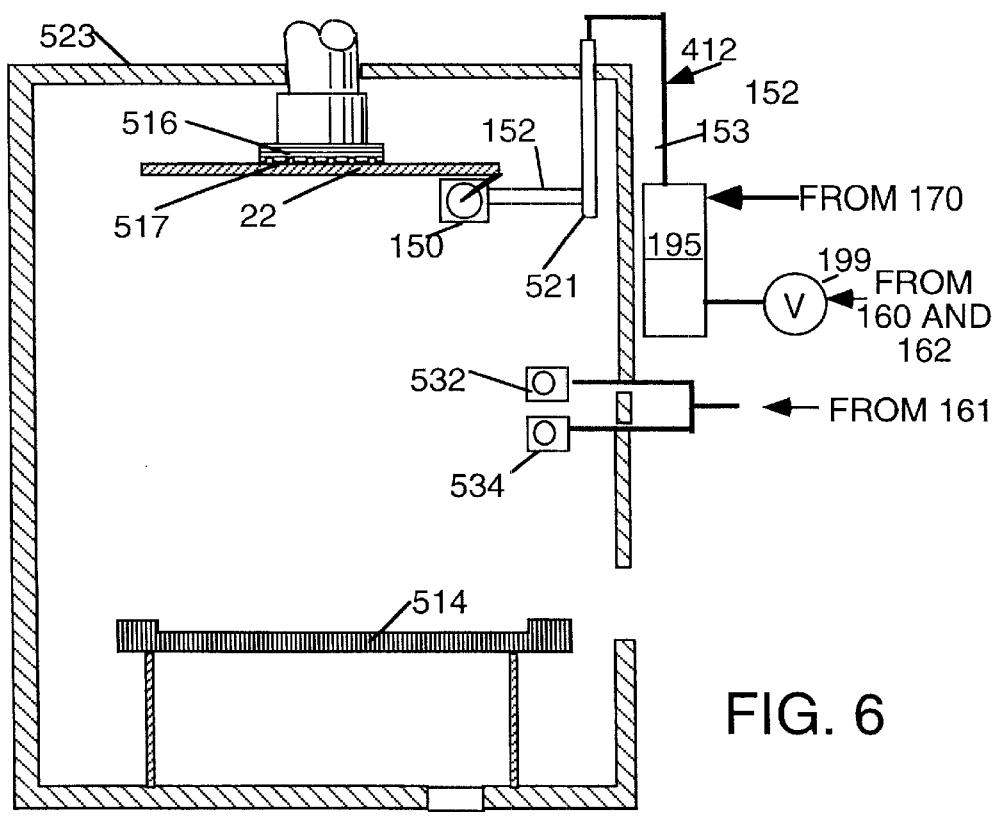
FIG. 6 is a vertical sectional view of the EBR chamber of FIG. 5 with the substrate positioned for processing.

The vacuum chuck 516 and a substrate 22 are shown in different raised positions in FIG. 5 and FIG. 6. After the vacuum chuck 516 picks the substrate off the platform 514, the chucked substrate is displaced into a pre process position, shown in FIG. 5. When the substrate is in the pre-process position, the actuator rotates the spindle 518, the vacuum chuck 516, and the substrate 22 at approximately 200 RPM as rinse water is applied through rinse water nozzles 532 and/or 534 over the respective upper and lower surface of the substrate. The rotation of the substrate through the spray of the rinse water nozzle 532 ensures that the spray from the rinse water nozzle 532 covers the entire upper surface of the substrate 22. The rotation of the substrate through the spray of the rinse water nozzle 534 ensures that the spray from the rinse water nozzle 534 covers the entire lower surface of the substrate 22. The rinsing of the upper and lower surfaces through the rinse water nozzles 532 and 534 rinse certain chemicals and other impurities from the surfaces of the substrate prior to the etchant is applied to the substrate from nozzles 150.

After a substrate is rinsed in the pre-process position, the vacuum chamber 516 raises the substrate 22 into the processing position shown in FIG. 6. When the substrate is in its process position, each nozzle 150 is displaced (under the action of actuator 527 as described above) to be adjacent to, and directed at, the lower surface (electroplated side 23) of the substrate 22. The rotary actuator 520 then accelerates the combined spindle 518, vacuum chuck 516, and substrate 22 to, for example, 1000 RPM. Etchant is then applied from the etchant tank 162 via the heating tank 195 to the outer periphery of the substrate 22 to remove the edge bead 36 (shown in FIG. 2) or the loose edge 306 (shown in FIG. 3). The positioning of the etchant stream from nozzles 150 has to be precisely positioned depending on intended function and size of the substrate. If removing material closer to the center of the substrate is desired (such as the separated edge deposit 39 shown in FIG. 3), then rotary actuator 154 rotates nozzles 150 in FIG. 1 toward the center of the substrate. If horizontally displacing the nozzles to position the nozzles closer or further from the container sidewall 522 is desired, then the rotary actuator 154 is actuated.

After the substrate 22 has been processed, the vacuum chuck 516 preferably is lowered to a post-process position also shown in FIG. 5. When the substrate is in the post-process position, the rotary actuator 520 rotates the spindle 518, the vacuum chuck 516, and the substrate 22 at approximately 200 RPM as rinse water is applied through rinse water nozzles 532 and/or 534 over the respective upper and lower surfaces of the substrate. Applying spray from the rinse water nozzles 532 and 534 to the surface of the substrate as the substrate rotates rinses the etchant, chemicals and other impurities from the respective upper and lower surfaces of the substrate.

Figure 4:
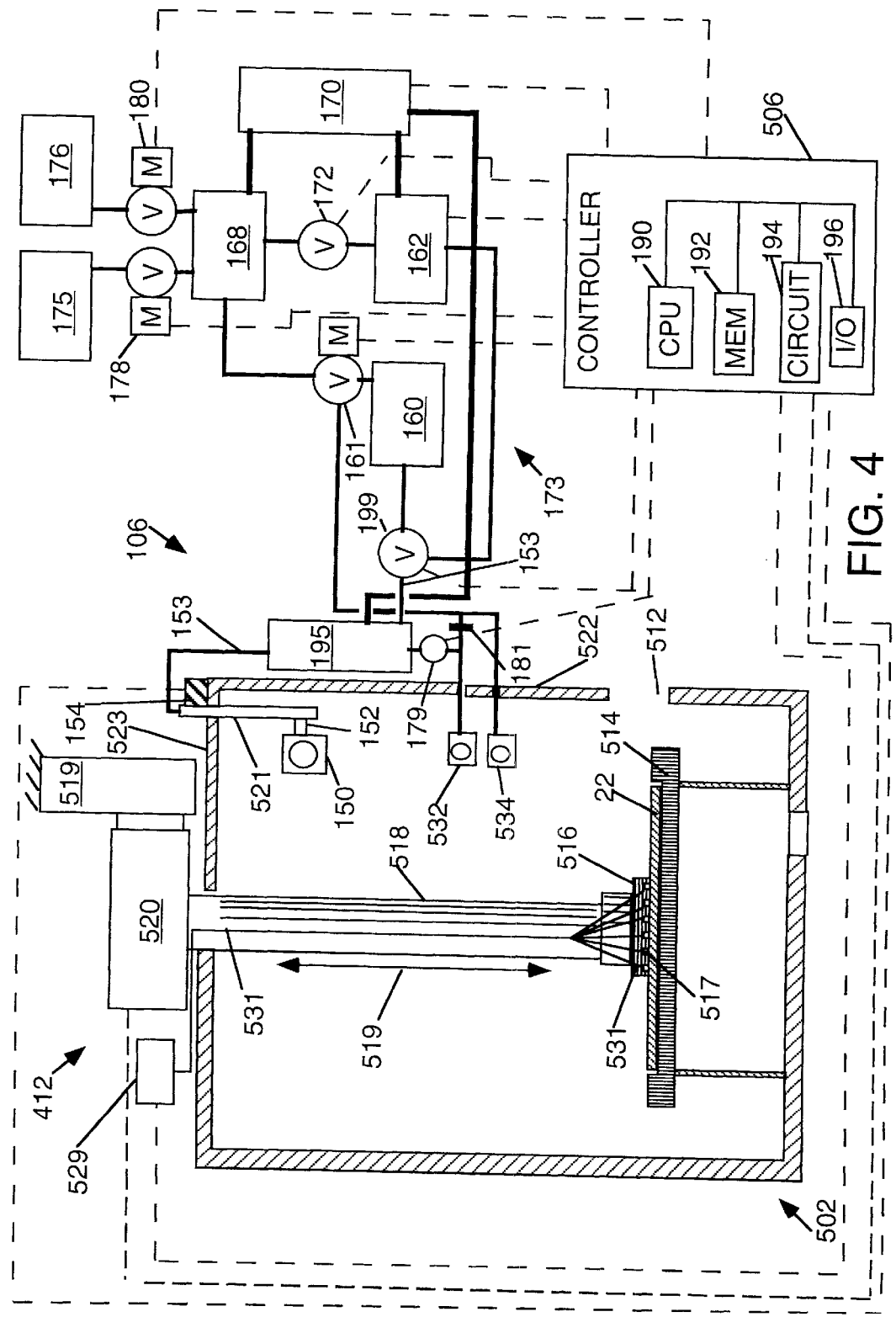
FIG. 4 is an elevational view, partially in cross section view of another embodiment of an edge bevel removal module from that shown in FIG. 1.

An alternate embodiment of EBR module 412, shown in FIG. 4, also includes a valve 179, a conduit 193, and a flow device 181 in addition to those components of the embodiment shown in FIG. 1. The conduit 193 extends from the heating tank 195 to the rinse water nozzle 532 to provide a diluted etchant solution applied from the rinse water nozzle 532 to the substrate. The valve 179 controls the fluid flow through the conduit 173. The controller 506 controls operation of valve 179. When the valve 179 is open, a prescribed amount of etchant from the heating tank 195 is applied with de-ionized water supplied from the de-ionized water source 160 to form a diluted etchant solution. The etchant applied from the heating tank 195 to via conduit 193 to the rinse water nozzle 532 is chemically identical to the etchant applied from the heating tank 195 to the nozzles 150, as described elsewhere in this application. The rinse water nozzle 532 applies the diluted etchant solution over that portion of the backside of the wafer that is not covered by the vacuum chuck 516. The diluted etchant solution is applied at sufficient strength to be capable of removing deposited materials and undesired contaminants from the backside (that is facing up in FIG. 5) of the substrate 22.

When the valve 179 is closed, the etchant from the heating tank 195 is not combined with the de-ionized water source 160 to form a diluted etchant solution. The rinse water nozzle 532 therefore applies de-ionized water over the backside of the wafer. The position of the valve 179 therefor controls the concentration of (or the complete lack of) etchant to be mixed with the de-ionized water to form the dilute etchant solution. The flow device 181 limits backflow of diluted etchant from the conduit leading to the rinse water nozzle 532 from flowing into the rinse water nozzle 534 and the de-ionized water source 160.

Following the application of the diluted etchant to the backside of the substrate, the valve 179 can be shut off causing the diluted etchant to be rinsed from the rinse water nozzle 534. The rinse water is then applied to the backside of the substrate 22 to rinse the backside of the diluted etchant. Although the diluted etchant is described as being applied through the same rinse water nozzle 532 to the backside of the substrate that applies de-ionized water, a separate nozzle than rinse water nozzle 532 can apply the diluted etchant. An operation that is often performed by a spin-rinse-dry (SRD) chamber is providing selected application of diluted etchant to large sections of the backside of a wafer. Applied Materials, Inc. of Santa Clara Calif. produces SRD chambers. One embodiment of SRD system is described in U.S. patent application Ser. No. 09/289,074, filed Apr. 8. 1999 and entitled: "ELECTRO-CHEMICAL DEPOSITION SYSTEM" (incorporated herein by reference).

To combine the components to form the etchant within the mixing module 173, de-ionized water, acid, and oxidizer are sequentially supplied respectively from the de-ionized water source 160, the acid supply 175, and the oxidizer supply 176. Small percentages of the total components from supplies 160, 175, and 176 can alternately be introduced into the mixing tank 168 to enhance the mixing procedure since small volumes of different chemical components mix more easily by diffusion than large volumes of different chemical components. The mixing of the chemical components is provided primarily because of diffusion of the different chemical components together to form an etchant. Expelling etchant from the mixing tank 168 into the etchant tank 162 causes further fluid turbulence of the chemical components that ensure that the etchant is mixed.

Pressure from source 170 is initially applied to the mixing tank 168 (but not etchant tank 162) to provide force to flow the etchant from the mixing tank 168 into the etchant tank 162. The controller 506 opens valve 172 to allow the etchant flow from the mixing tank to the etchant tank. The combined chemicals from the mixing tank 168 fills the etchant tank 162 to a desired level. The controller 506 then closes valve 172 and applies pressure from pressure source 170 to the etchant tank 162; the pressure is no longer applied from the pressure source 170 to the mixing tank 168. Pressure from the pressure source 170 expels the etchant from the etchant tank 162 into conduit 153 when valve 199 is opened.

During operation, mixing tank 168 and etchant tank 162 interact to provide a constant and fresh supply of etchant to the EBR chamber 502. Etchant tank 162 is maintained at a nearly filled position during operation. The level of etchant in the etchant tank is determined by the low level sensor 904 integrated in the etchant tank 162 as described above relative to the embodiment shown in FIG. 9. When the level of etchant in etchant tank 162 falls below a predetermined threshold, then the controller 506 actuates the monitoring valves 161, 178, and 180 as described above to combine more chemicals into the mixing tank 168. During a brief diffusion period (whose duration varies based on the system and chemical configuration) the combined chemicals diffuse into etchant. The etchant is then dispensed from the mixing tank into the etchant tank 162. The controller 506 can therefore mix a selected amount of etchant in the mixing tank 168 that corresponds to the amount that is required to fill the etchant tank 162.

The above-described mixing tank 168 and etchant tank 162 interaction minimizes the etchant that must be premixed and stored, while still providing an adequate supply of fresh etchant to supply the nozzles 150 in the EBR chamber 502. Typically, 30 ml/wafer of etchant is used for edge bead removal for each wafer for a 200 mm wafer. The copper etchant to be used comprises a mixture of an acid (either sulfuric or citric acid) and an oxidizer (hydrogen peroxide). This mixture is an effective copper etchant, but is chemically unstable thus deteriorating due to the accelerated decomposition of hydrogen peroxide in the presence of acid, to form water and oxygen. Deterioration may take as long as four days.

The etchant is particularly chemically unstable at the same time elevated temperatures that increases etch rates and increase throughput. The current invention eliminates these considerations by mixing the two component chemicals online in a point of use mixing process. This point of use mixing keeps the required duration between when the chemicals are mixed to when they are used as short as possible. Such point of use mixing in the mixing tank replenishes a limited supply of chemicals as the chemicals are being used. The etchant contained in the mixing tank 168 can be diluted to the desired concentration of 6 percent by weight of hydrogen peroxide as the oxidizer, 2 percent by weight of sulfuric acid, and 92 percent by weight of de-ionized water. House de-ionized water can be supplied from the de-ionized water source 160. Chemical ratios and dilution rates can be changed to meet the specific needs of the process.

The etchant is then pumped into the conduit 153 that is in fluid communication with the nozzles 150. Heating elements in the heating tank 195 heat the etchant contained in the heating tank to between 25–65 degrees, depending on the chemical make-up of the etchant. The etchant is then dispensed onto the substrate for bevel copper removal and backside cleaning. The mixing time is recorded for each etchant mixed. If the total idle time that a mixture of etchant remains mixed in the etchant tank or the heating tank prior to use exceeds a predetermined value (such as 3 to 4 days) the etchant in the etchant tank 162 will be discarded through a module drain and the EBR module 412 is cleaned. Operators of the EBR module 412 can therefore maintain a potent and sufficient supply of etchant without the excessive expense associated with discarding large amounts of etchant that have gone bad. These expenses result because the chemicals that produce etchant are expensive, and considerable time is required to clean the etching chamber. Since only a small amount of chemical etchant is stored in the etchant tank 162 or the heating tank 195 is at any given time, chemical wastage is minimized.

In one embodiment, rotary actuator 520 rotates the substrate 22 during the EBR process to provide substantially equal exposure to the etchant at the peripheral portion of the substrate. Preferably, the substrate 22 is rotated in the same direction as the direction of the etchant spray pattern to facilitate controlled edge bead removal adjacent the bevel edge 33. For example, as shown in FIG. 7, the substrate is rotated in a counter-clockwise direction (arrow A) that corresponds to the counter-clockwise spray pattern. The substrate is preferably rotated at an angular velocity between about 100 rpm to 1000 rpm, more preferably between about 500 rpm and 1000 rpm. The effective etch rate (i.e., the amount of copper removed divided by the time required for removal) is a function of the etch rate of the etchant, the velocity of the etchant contacting the substrate edge, the temperature of the etchant, the number of nozzles, and the velocity of the substrate rotation. These parameters can be varied to achieve particular desired results.

The number of nozzles 150 directed at a substrate factors into the etch rate since etchant applied from a single nozzle remains in contact with the etchant for only a portion of the rotation of the substrate. Providing multiple radially spaced nozzles 150 around the substrate increase the radial angle of travel (and the amount of time) that the substrate is covered by etchant during each substrate rotation. In another embodiment, the substrate is maintained stationary during processing. The mixture of etchant including 2% sulfuric acid by weight, 6% hydrogen peroxide by weight, and 92% water by weight can etch a 1 $\mu$m thick film of copper in 15 seconds. The etching by the EBR module described above produces a clean division (of ½ to ¾ mm) between the etched and the non-etched portions. With this etching rate, throughput of the EBR module 502 can reach 72 wafers per hour.

Figure 3:
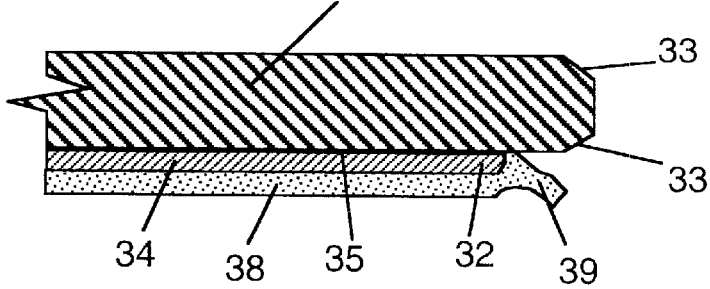
FIG. 3 is a cross sectional view of another substrate in which a deposition layer adjacent to the periphery of the substrate is peeling.

The etching process is performed for a pre-determined time period sufficient to remove the edge bead 36 shown in FIG. 2 or the separated edge deposit 39 that is separated from the substrate shown in FIG. 3. The substrate is then preferably cleaned with de-ionized water that supplied from the rinse water nozzles 532, 534. This application of water from the rinse water nozzle 532 and 534 occurs while the substrate 22 is in the post processing position has been referred to above as a spin-rinse-dry (SRD) process. The SRD process typically involves delivering de-ionized water to the substrate to rinse residual etchant and other chemicals from the substrate and spinning the substrate at a high speed to dry the substrate. The substrate is then transferred out of the EBR chamber 502 after the EBR and SRD processes, and the substrate is ready for subsequent processing.

Although various embodiments that incorporate the teachings of the present invention have been shown and described in detail herein, those skilled in the art can readily devise many other varied embodiments that still incorporate these teachings.

What is claimed is:

1. An etchant mixing assembly for a semiconductor processing system, comprising:
   at least one acid source;
   at least one oxidizer source;
   a mixing tank selectively in fluid communication with the at least one acid source and the at least one oxidizer source;
   a mixed etchant tank in fluid communication with the mixing tank; and
   a system controller configured to sense a low level of fluid in the mixed etchant tank, cause a fresh fluid solution to be mixed in the mixing tank, and cause the fresh fluid solution to the communicated to the mixed etchant tank.

2. The etchant mixing assembly of claim 1, further comprising a heating tank in fluid communication with the mixed etchant tank and at least one fluid dispensing nozzle in the semiconductor processing system, the heating tank being configured to heat a fluid solution received from the mixed etchant tank prior to the fluid solution being delivered to the at least one fluid dispensing nozzle.

3. The etchant mixing assembly of claim 1, further comprising a deionized water source in fluid communication with at least one fluid dispensing nozzle in the semiconductor processing system.

4. The etchant mixing assembly of claim 1, further comprising a plurality of selectively actuated valves in electrical communication with the system controller, the plurality of selectively actuated valves being configured to regulate the flow of fluids from the at least one acid source, the at least one oxidizer source, the mixing tank, and the mixed etchant tank.

5. The etchant mixing assembly of claim 1, further comprising a source of fluid pressure in fluid communication with the mixing tank and the mixed etchant tank, the source of fluid pressure being configured to urge fluids to be transported via conduits between the mixing tank, the etchant tank, and the semiconductor processing system.

6. The etchant mixing assembly of claim 1, wherein the mixing tank is configured to mix a volume of acid with a volume of peroxide and communicate the mixture to the etchant tank.

7. The etchant mixing assembly of claim 1, wherein the etchant tank includes at least one sensor for determining when a volume of etchant solution in the etchant tank is below a predetermined level.

8. The etchant mixing assembly of claim 7, wherein the at least one sensor is in communication with the system controller, the system controller being configured to receive a signal from the at least one sensor indicating that the etchant solution is below the predetermined level, and in response thereto, cause the fresh fluid solution to be mixed in the mixing tank.

9. The etchant mixing assembly of claim 1, wherein the system controller is configured to control the operation of a plurality of selectively actuated valves positioned between the at least one acid source, the at least one peroxide source, the mixing tank, and the etchant tank.

10. Apparatus for removing unwanted deposits of electroplating material disposed on an electroplated substrate, comprising:
   an unwanted deposit removal chamber;
   a rotatable substrate support disposed in the unwanted deposit removal chamber that supports the electroplated substrate;
   an actuator that rotates said rotatable substrate support;
   at least one spray nozzle positioned in the unwanted deposit removal chamber directed at the unwanted deposits disposed on the substrate;
   an etchant conduit fluidly connected to each of the at least one spray nozzles;
   a mixing tank in fluid communication with an acid source and an oxidizer source;
   an etchant tank in fluid communication with the mixing tank and the etchant conduits; and
   a pressure source, fluidly connected to said mixing tank and said etchant tank, the pressure source being configured to urge fluids from the mixing tank and the etchant tank though said conduits to said at least one spray nozzle.

11. The apparatus of claim 10, wherein the oxidizer source comprises a hydrogen peroxide generator.

12. The apparatus of claim 10, comprising:
   at least one additional nozzle directed at said substrate; and
   a source of rinsing liquid connected to said additional nozzle.

13. An apparatus that supplies etchant to a substrate positioned in a chamber comprising:
   an etchant tank capable of storing etchant;
   a fluid level sensor coupled to the etchant tank;
   a mixing tank in fluid communication with the etchant tank, the mixing tank being configured to mix one or more chemical components into an etchant solution in response to the fluid level sensor; and
   a controller programmed to:
      store etchant in the etchant tank,
      sense a low level of etchant in the etchant tank,
      mix one or more chemical components into a fresh etchant solution in the mixing tank in response to the sensed level,
      transport the fresh etchant solution from the mixing tank to the etchant tank, and
      apply the etchant to the substrate via at least one fluid conduit connecting a fluid dispensing nozzle to the etchant tank.

14. A semiconductor processing system for removing unwanted deposits from a substrate, comprising:
   a substrate support member configured to rotatably support a substrate thereon;
   at least one fluid dispensing nozzle positioned proximate a perimeter portion of the substrate, the at least one nozzle being configured to dispense a fluid solution onto the perimeter portion of the substrate; and
   a mixing module configured to provide an etchant solution to the at least one fluid dispensing nozzle, the mixing module comprising:
      an acid source;
      a peroxide source;
      a mixing tank in fluid communication with the acid source and the peroxide source via selectively actuated source valves;
      an etchant tank in fluid communication with the mixing tank via a selectively actuated fluid transfer valve positioned between the mixing tank and the etchant tank; and
      a system controller configured to control the operation of the source valves and the fluid transfer valve.

15. The semiconductor processing system of claim 14, wherein the mixing module further comprises a pressure source in fluid communication with the mixing tank and the etchant tank.

16. The semiconductor processing system of claim 14, further comprising a heating tank positioned in fluid communication with the at least one fluid dispensing nozzle and the mixing module, the heating tank being configured to heat a fluid solution received from the mixing module prior to passing the fluid solution to the at least one fluid dispensing nozzle.

17. The semiconductor processing system of claim 14, wherein the mixing tank is configured to mix a volume of acid with a volume of peroxide and communicate the mixture to the etchant tank.

18. The semiconductor processing system of claim 14, wherein the etchant tank includes a low fluid level sensor configured to determine when a fluid etchant level therein is low.

19. The semiconductor processing system of claim 18, wherein the low fluid sensor is in communication with the system controller, the system controller being configured to receive a signal from the low fluid sensor and cause a fresh fluid solution to be mixed in the mixing tank and communicated to the etchant tank.

* * * * *

UNITED STATES PATENT AND TRADEMARK OFFICE
CERTIFICATE OF CORRECTION

PATENT NO.    : 6,494,219 B1
DATED         : December 17, 2002
INVENTOR(S)   : Nayak et al.

It is certified that error appears in the above-identified patent and that said Letters Patent is hereby corrected as shown below:

Column 1,
Line 5, please insert -- Provisional Application Information --.
Line 11, please delete "Provisonal Application Information".

Column 5,
Line 4, please change "wafer" to -- water --.

Column 6,
Line 52, please change "wafer" to -- water --.

Signed and Sealed this

Twenty-fourth Day of June, 2003

JAMES E. ROGAN
*Director of the United States Patent and Trademark Office*